(12) United States Patent
Issakov

(10) Patent No.: US 9,048,789 B2
(45) Date of Patent: Jun. 2, 2015

(54) CURRENT RE-USING WIDEBAND LOW-NOISE ACTIVE BALUN

(71) Applicant: Intel Mobile Communications GmbH, Neubiberg (DE)

(72) Inventor: Vadim Issakov, Duesseldorf (DE)

(73) Assignee: Intel Mobile Communications GmbH, Neubiberg (DE)

( * ) Notice: Subject to any disclaimer, the term of this patent is extended or adjusted under 35 U.S.C. 154(b) by 56 days.

(21) Appl. No.: 13/795,957

(22) Filed: Mar. 12, 2013

(65) Prior Publication Data

US 2014/0266469 A1 Sep. 18, 2014

(51) Int. Cl.
*H03F 3/16* (2006.01)
*H03F 1/02* (2006.01)

(52) U.S. Cl.
CPC ............ *H03F 3/16* (2013.01); *H03F 2200/372* (2013.01); *H03F 1/0283* (2013.01)

(58) Field of Classification Search
CPC .................... H03F 2200/372; H03F 2200/294; H03F 3/45475; H03F 2200/451; H03F 1/26; H03F 3/28; H03F 3/36; H03F 3/1935; H03F 3/193
USPC .............................. 330/117, 277, 301; 333/25
See application file for complete search history.

(56) References Cited

U.S. PATENT DOCUMENTS

| | | | | |
|---|---|---|---|---|
| 7,692,493 | B1 * | 4/2010 | Chen et al. ..................... | 330/301 |
| 8,013,651 | B2 * | 9/2011 | Lee et al. ........................ | 327/231 |
| 2011/0063032 | A1 * | 3/2011 | Lee ................................ | 330/301 |

OTHER PUBLICATIONS

Jun Wu, et al.; "A Dual-Band LNA with Active Balun for GNSS Receivers"; 2010 IEEE; p. 1-3.
Dengjun Lai, et al.; "A CMOS Single-Differential LNA and Current bleeding CMOS Mixer for GPS Receivers"; 2010 IEEE; p. 677-680.
Jonho Ko, et al.; "A 19-mW 2.6-mm2 L1/L2 Dual-Band GMOS GPS Receiver"; IEEE Journal of Solid-State Circuits, vol. 40, No. 7, Jul. 2005, p. 1414-1425.
Naveen K. Yanduru, et al.; "A Highly Integrated GPS Front-End for Cellular Applications in 90nm CMOS"; 2008 IEEE; p. 1-4.
Donggu Im, et al.; "A CMOS Active Feedback Wideband Single-to-Differential LNA Using Inductive Shunt-Peaking for Saw-less SDR Receivers"; IEEE Asian Solid-State Circuits Conference; Nov. 8-10, 2010/Beijing China, p. 1-4.
Y. Ji, et al.; "1.8 dB Nf 3.6 mW CMOS Active Balun Low Noise Amplifier for GPS"; Electronics Letters, Feb. 4, 2010, vol. 46, No. 3, p. 1-2.
S. Chehrazi, et al.; "A 6.5 GHz Wideband GMOS Low Noise Amplifier for Multi-Band Use"; IEEE 2005 Custom Integrated Circuits Conference; 2005 IEEE; p. 801-804.

* cited by examiner

*Primary Examiner* — Khanh V Nguyen
(74) *Attorney, Agent, or Firm* — Eschweiler & Associates, LLC

(57) ABSTRACT

Some aspects of the present disclosure relate to a low-noise amplifier (LNA) having a balun configuration. The LNA includes a DC current path coupling a first DC supply node to a second DC supply node. First and second output nodes and first and second input nodes are spaced apart along a length of the DC current path. A single-ended radio frequency (RF) input terminal is configured to deliver a single-ended RF signal to the first and second input nodes. A differential RF output terminal is made up of the first and second output nodes. The first and second output nodes are configured to cooperatively establish a differential output signal based on the single-ended RF signal. Other devices and methods are also disclosed.

6 Claims, 11 Drawing Sheets

800

CURRENT RE-USING WIDEBAND LOW-NOISE ACTIVE BALUN

BACKGROUND

Low Noise Amplifiers (LNAs) are a key component in wireless receiver front-ends. Design of an LNA involves numerous trade-offs between noise figure, gain, linearity, impedance matching, current consumption, and chip area. The present disclosure provides LNAs that exhibit favorable characteristics for some applications.

DETAILED DESCRIPTION

Figure 1:
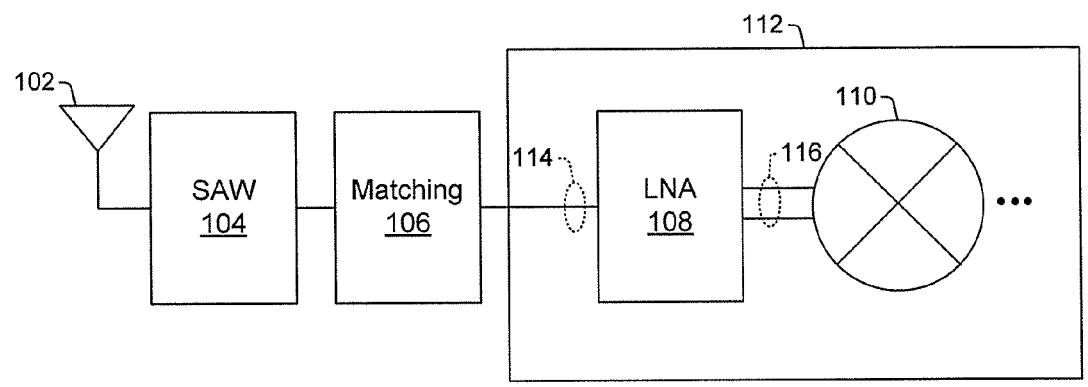
FIG. 1 shows an example of a receiver that can make use of an LNA having a balun configuration.

The present disclosure will now be described with reference to the attached drawing figures, wherein like reference numerals are used to refer to like elements throughout, and wherein the illustrated structures and devices are not necessarily drawn to scale.

As will be appreciated in greater detail herein, the present disclosure relates to improved LNAs having a balun configuration. In a balun configuration, an LNA converts a balanced signal (e.g., differential signal) to an unbalanced signal (e.g., single-ended signal), or vice versa. In particular, whereas conventional LNAs used two or more distinct DC current paths that were fed with a differential radio frequency (RF) input signal; the LNAs of this disclosure include a single DC current path that is fed with a single-ended RF input signal. Thus, instead of having two separate DC current paths, the present techniques use a single DC current path to realize both inverting and non-inverting amplification to establish a differential amplified signal. Among other advantages, this configuration helps reduce manufacturing costs and power consumption. Indeed, techniques in accordance with the present disclosure can avoid using expensive metallization options having a thick metal for RF applications. Additionally, some disclosed techniques can reduce chip area, as this configuration is intended to operate with a resistive load in its primary implementation, which avoids the use of a bulky transformer as a balun.

FIG. 1 shows an example of a portable electronic receiver 100, such as used in a mobile phone or tablet for example. The receiver 100 includes an RF antenna 102, surface acoustic wave (SAW) filter 104, matching network 106, low noise amplifier (LNA) 106, and mixer 110, which collectively process data that is wirelessly received. Typically, the LNA 108, mixer 110, and other un-illustrated components in reception path are arranged on an integrated circuit 112; while the antenna 102, SAW 104, and matching network 106 are on another integrated circuit or assembled as separate components on a printed circuit board. As will be appreciated in greater detail below, LNA 108 has a single-ended input 114 coupled to a bond pad on IC 112 and uses a single DC current path to convert the single-ended input 114 to a differential output signal 116. It is desirable to have a differential signal downstream of the LNA 108, due to superior common-mode noise immunity, rejection to parasitic couplings, increased dynamic range, and ground bounce insensitivity gained from using a differential signal.

By using a single DC current path, LNA 108 reduces current and reuses DC current to feed inverting and non-inverting branches of the circuit. This is particularly true because LNAs include digital circuitry, which scales in terms of die area for successive technology nodes, but also include analog circuitry, which is bulky and may not scale as well for successive technology nodes. By eliminating analog circuitry required for additional DC current paths, the single DC current path of LNA 108 reduces manufacturing costs. Further, the received RF signal from the antenna 102 and SAW filter 104 is typically single-ended, and conventional solutions have utilized an off-chip balun to convert the single-ended signal to a differential signal for the analog front-end. Although such a conventional solution is sufficient in some respects, the balun has some associated costs and also requires the use of two pins on the LNA's integrated circuit, due to the differential signal provided to the LNA in such an instance. To reduce the number of pins and to eliminate the need for the off-chip balun, the LNA 108, which is in an on-chip balun configuration, converts single-ended signal 114 to differential signal 116 with limited hardware.

Figure 2:
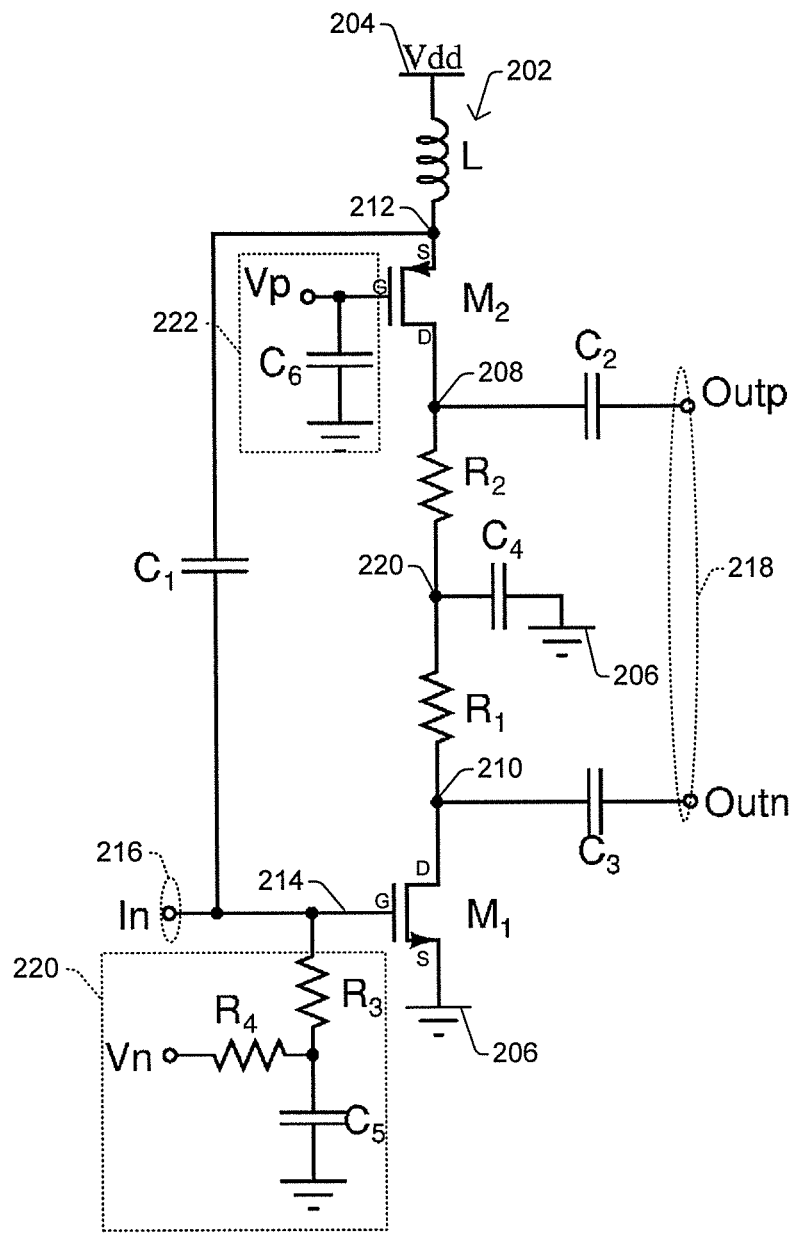
FIG. 2 shows an example of an LNA having a single DC current path that includes resistive loads.

FIG. 2 shows an example of a LNA 200 having a balun configuration in accordance with this disclosure. As shown in FIG. 2, a single DC current path 202 couples a first DC supply node 204 (e.g., VDD) to a second DC supply node 206 (e.g., VSS or ground). First and second input nodes (212, 214) and first and second output node (208, 210) are spaced apart along a length of the DC current path 202. A single-ended radio frequency (RF) input terminal 216 is configured to deliver a single-ended RF signal to the first and second input nodes (212, 214). The first input node 212 corresponds to source of PMOS transistor M2, which is in a common-gate configuration (non-inverting); while the second input node 214 corresponds to gate of NMOS transistor M1, which is a common-source configuration (inverting). Source of PMOS transistor M2 can be coupled to the first DC supply node 204, and at the same time single-ended RF signal 216 is provided at the first node 212 (e.g., source of PMOS transistor M2).

DC current flows over the DC current path 202 through inductor L, which acts as an RF choke/DC feed, and enables operation of both transistors M1, M2, which act as amplifiers. Resistor R2 acts as a load for PMOS transistor M2, while resistor R1 acts as a load for NMOS transistor M1.

The RF signal entering at the single-ended RF input 216 follows two paths: an inverting path goes through transistor M1, is terminated by load R1, and goes into negative output terminal Outn; while a non-inverting path goes through transistor M2, is buffered by load R2, and goes into positive output terminal Outp. Thus, the first and second output nodes 208, 210 are configured to cooperatively establish a differential output signal at differential RF output terminal 218, based on the single-ended RF signal.

A virtual AC ground point 220 is arranged between the first and second output nodes (208, 210). A capacitor C4 couples the virtual AC ground point 220 to the second DC supply node 206. The capacitor C4 creates a virtual AC ground at virtual AC ground point 220. This means the RF signal is shorted at the virtual AC ground point 220 and this point acts as the virtual ground for the differential output 218.

The input impedance of LNA 200 is dominated by the impedance looking at the source of transistor M2, which in first order approximation is given by $Z_{in} \approx 1/g_{m2}$. The more exact expression is given by:

$$Z_{in} \approx \frac{R_2 + r_{ds2}}{1 + (g_{m2} + g_{mb2})r_{ds2}}$$

where $g_{m2}$ is the transconductance and $r_{ds2}$ is the small-signal output resistance of the transistor M2, and $g_{mb2}$ is the bulk transconductance of transistor M2. Thus, a broadband matching to 50Ω is achieved by controlling the transconductance of M2.

Gain of the common-gate stage corresponding to M2 is approximately $g_{m2} \cdot R_2$, while gain of the common-source stage corresponding to M1 is approximately $-g_{m1} \cdot (R_1 \| r_{ds1})$, where $r_{ds1}$ is the small-signal output resistance of transistor M1. Thus, by controlling the size of the transistors M1, M2 and the bias voltages Vn, Vp, the amplitude balance can also be controlled. The phase balance of the LNA 200 is controlled by the phase delay on both RF paths.

The single-ended RF signal 216 is forwarded to the source of M2 through the capacitor C1, which acts simply as an AC coupling element. Thus, the bias voltage established by first bias circuit 220 can be set independent of the first supply voltage (e.g., VDD). The positive output signal Outp is picked up from the drain of M2. The gate of M2 is AC grounded by a large bypass capacitor C6 and potential Vp is applied at its gate by second bias circuit 222.

The potential at the gate of the transistor M1 is provided through a large resistor R3. Again, a bypass capacitor C5 is used to stabilize the bias voltage and make a better AC ground at that node.

The single-ended RF input signal 216 is sensed simultaneously at gates of M1 and M2 (with a minor delay due to the phase shift on C1, which is negligible for sufficiently large C1). This circuit gives limited delay between single-ended RF input 216 and differential RF output 218 and a very good amplitude and phase balance.

The low-noise performance is provided by partially cancelling out the noise current of the common-gate amplifier corresponding to M2. A fraction of current through M2 flows into R2 and the source impedance (e.g., source impedance of 50Ω). The source impedance at the input induces an in-phase amplified noise current in R1 by driving the gate of M1. Therefore, if the resulting noise voltages at the two output terminals are equal, then the noise of M2 is in common-mode and can be cancelled by differential sensing. The condition for noise cancellation is $g_{m1}R_1 = g_{m2}T_2$.

Therefore, the main contribution to the differential output noise stems from M1 and the thermal noise of the resistors. The overall noise figure is still sufficiently low.

The inductor L acts as an RF choke to block the RF input signal 216 at the first DC supply 204 and at the same time it provides DC current path to Vdd at the source of transistor M2. The quality factor of the inductor L at this position is less critical for the noise figure. For cost reasons, it might be advisable to integrate inductor L into the package, such as realizing it as embedded passive in redistribution layer, but the inductor can also be integrated on-chip. The resonance frequency created by the AC coupling capacitor C1 and the inductor L is given by:

$$f_0 = \frac{1}{2\pi\sqrt{LC_1}}$$

This resonant frequency should be well below the operation frequency of the circuit.

Capacitors C2 and C3 are used to AC couple the differential RF output signal 218 to the following stage (not shown).

FIG. 2's circuit offers several advantages: (1) It offers low current consumption, as it reuses a single DC current to realize two amplifiers in one branch. (2) It realizes single-ended input to differential output conversion with low-noise figure with only a single passive inductive component that can be integrated externally. (3) It provides a very good broadband matching due to the common-gate structure and due to the fact that no resonant circuits are used. (4) Excellent phase and amplitude balance can be achieved simply by controlling the transconductance (unlike most types of active baluns, the amplitude and phase balance are not dependent on matching of the transistors).

Figure 3:
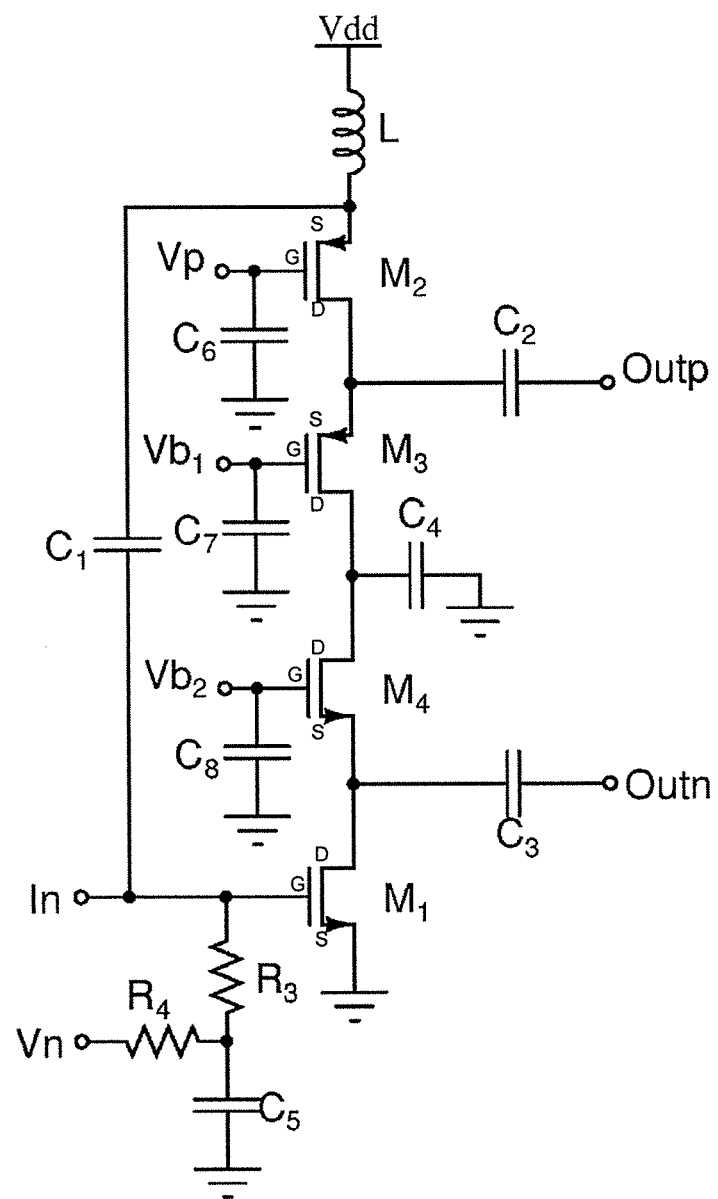
FIG. 3 shows an example of an LNA having a single DC current path that includes active loads.

FIG. 3 shows another embodiment of an LNA 300 where the passive resistors R1, R2 from FIG. 2 have been replaced by active loads. In particular, R2 from FIG. 2 has been replaced by a PMOS transistor M3 having its gate coupled to voltage potential Vb1, which sets the resistance value of the PMOS transistor if M3 is intriode. Alternatively, the PMOS transistor M3 may be operated in saturation and act as a cascode device. Further, R1 from FIG. 2 has been replaced by an NMOS transistor M4 having its gate coupled to voltage potential Vb2, which sets the resistance value of the NMOS transistor.

Figure 4:
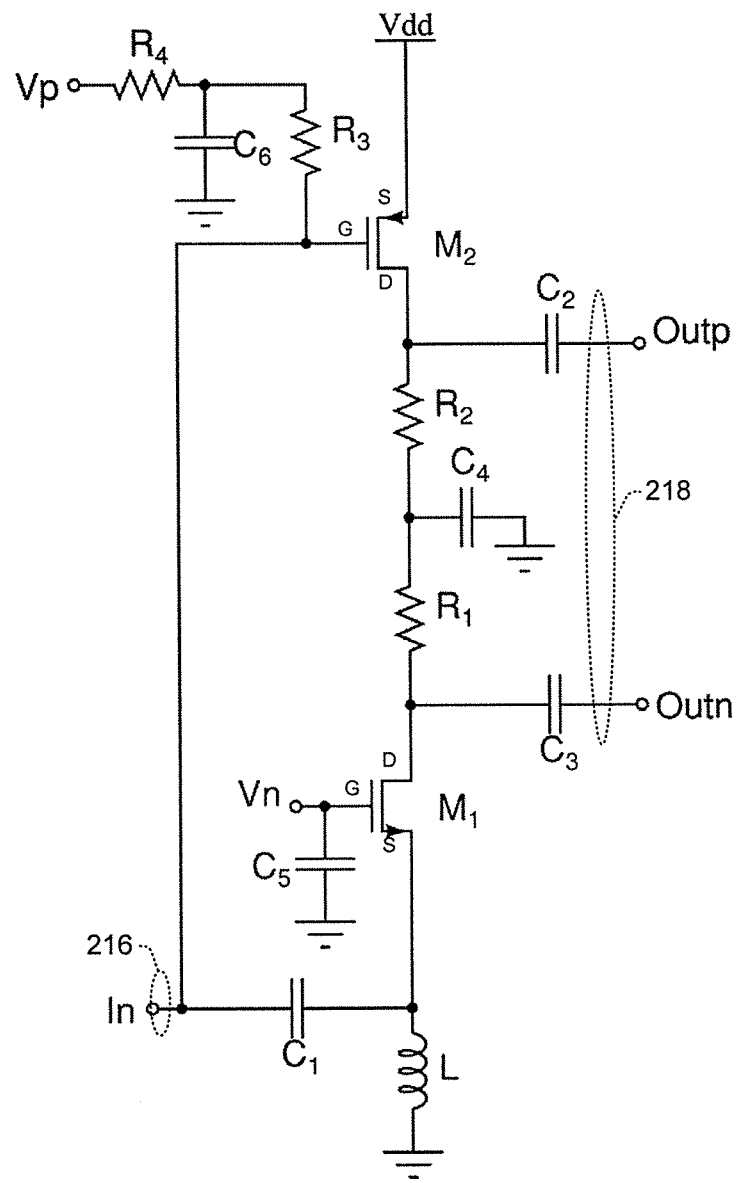
FIG. 4 shows an example of an LNA where the input connections and biasing circuit of FIG. 2 have been rearranged so the common-source NMOS transistor of FIG. 2 is replaced by a common gate NMOS transistor in FIG. 4 and the common gate PMOS transistor of FIG. 2 has been replaced by a common source PMOS transistor in FIG. 4.
Figure 5:
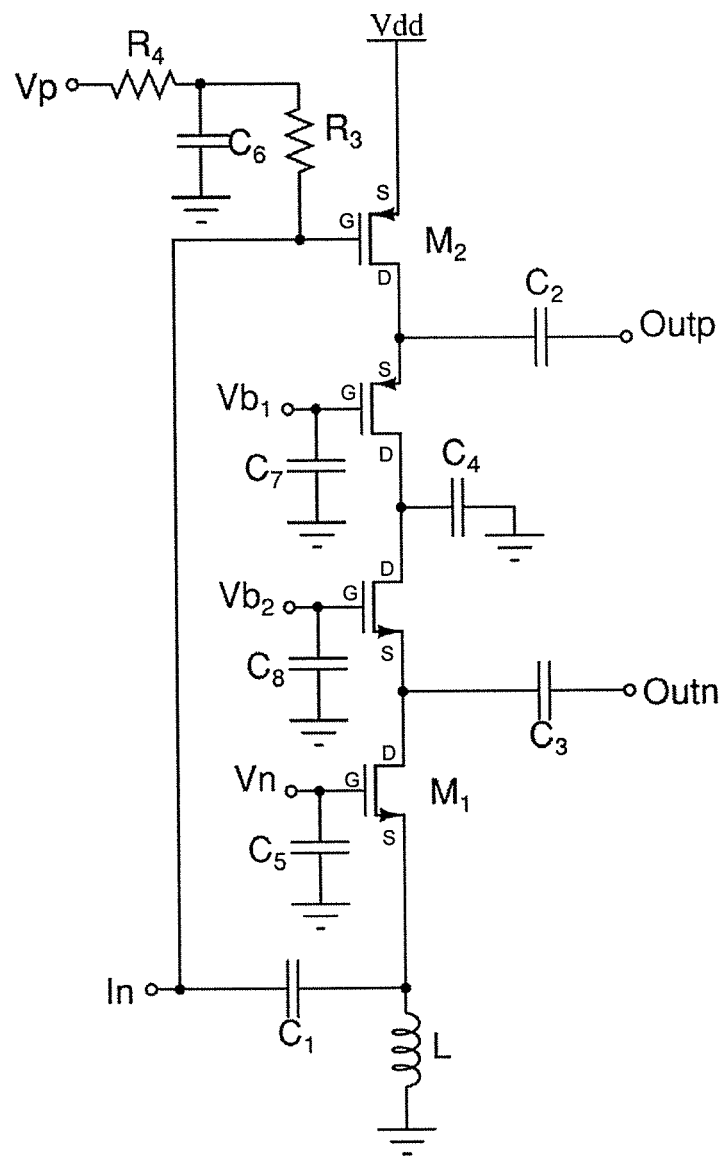
FIG. 5 shows an example of an LNA where the input connections and biasing circuit of FIG. 3 have been rearranged so the common-source NMOS transistor of FIG. 3 is replaced by a common gate NMOS transistor in FIG. 5 and the common gate PMOS transistor of FIG. 3 has been replaced by a common source PMOS transistor in FIG. 5.

FIG. 4 shows another embodiment of an LNA 400. In this embodiment, the two amplifier stages of FIG. 2 have been "flipped" relative to one another. Thus, the single-ended RF input signal 216 is coupled to gate of PMOS transistor M2, which is in a common-source configuration, and is also simultaneously sensed at the source of NMOS transistor M1, which is in a common-gate configuration. FIG. 5 shows another embodiment of a LNA 500 which is similar to that of FIG. 4, albeit with active loads M3, M4 replacing the passive resistors R2, R1 illustrated in FIG. 4.

Figure 6:
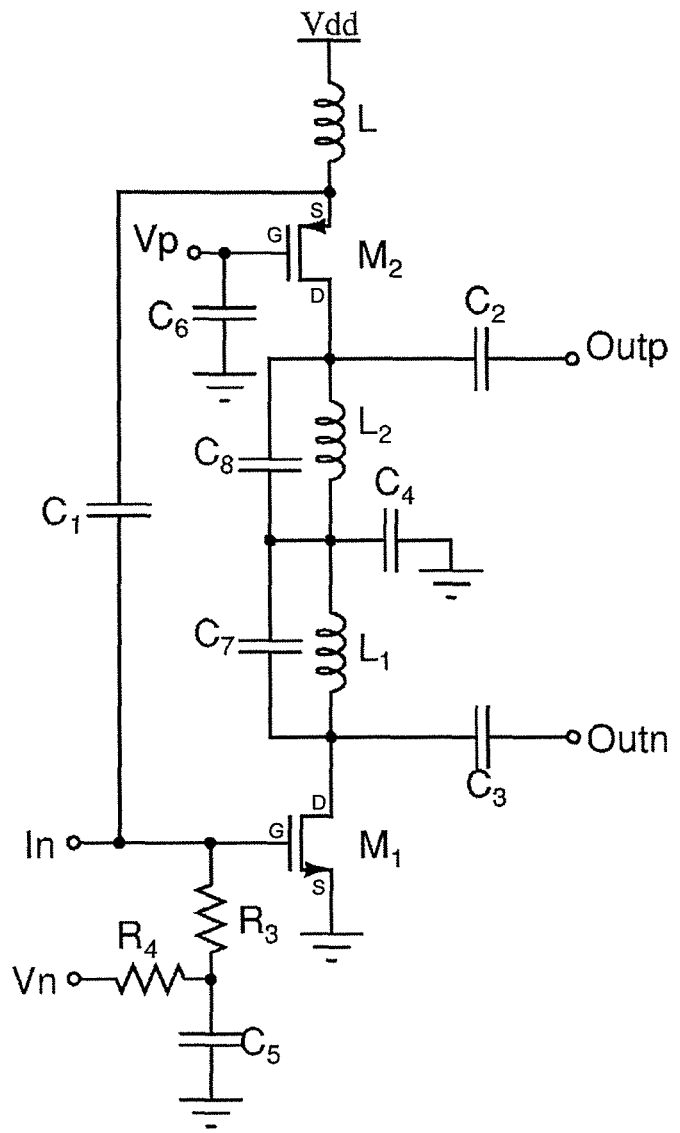
FIG. 6 shows an example of an LNA that includes an LC resonant tank as the load.

FIG. 6 shows an example of an LNA 600 where on-chip passive inductors L1, L2 replace the passive resistors R1, R2 and active resistors of previous embodiments. In FIG. 6's embodiment, the capacitance values of capacitors C7, C8 are selected such that the L1, C7 and L2, C8 act as LC tank circuits, which resonate at the center frequency of the application of interest. Due to the presence of the on-chip passive inductors L1, L2, which can be implemented as spiral-like forms on the surface on a chip, this implementation tends to consume more chip area than some previous implementations. L1 and L2 can be realized as a single inductor with a middle tap, or preferably as a differential inductor. This can save some area by making use of magnetic coupling.

Figure 7:
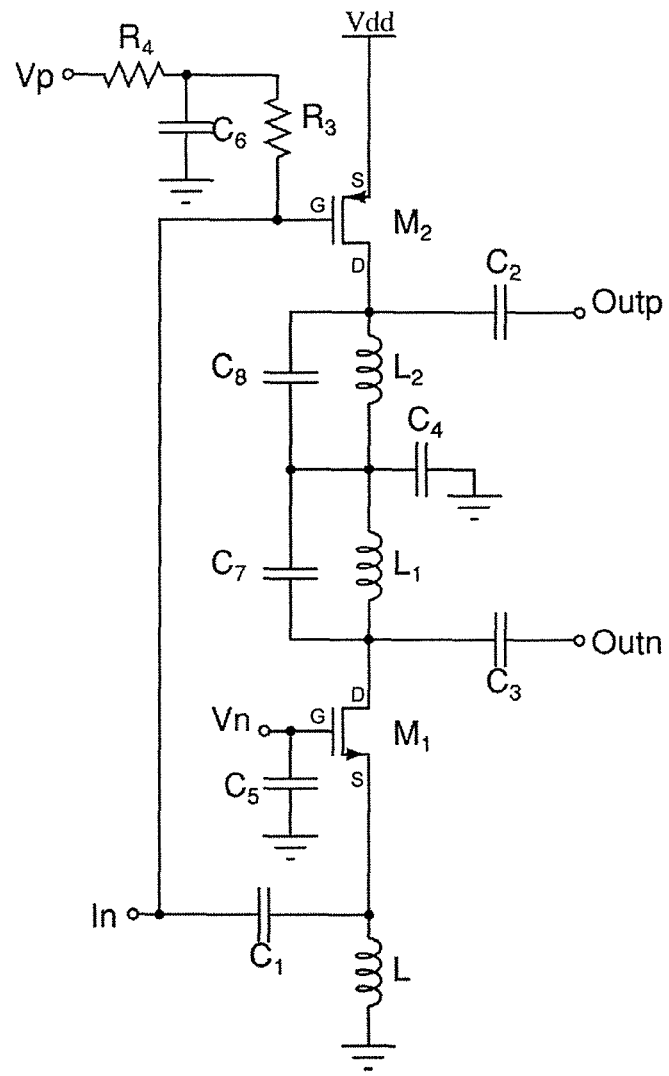
FIG. 7 shows an example of an LNA that includes an LC resonant tank as in FIG. 6, but where the input connections and biasing circuit have been rearranged so the common-source NMOS transistor of FIG. 6 is replaced by a common gate NMOS transistor in FIG. 7 and the common gate PMOS transistor of FIG. 6 has been replaced by a common source PMOS transistor in FIG. 7.

FIG. 7 shows another example of an LNA 700, which is similar to FIG. 6, albeit with the two amplifier stages "flipped" relative to those illustrated in FIG. 6. Thus, in FIG. 7, the single-ended RF input signal is coupled to gate of PMOS transistor M2, which is in a common-source configuration, and is also simultaneously sensed at the source of NMOS transistor M1, which is in a common-gate configuration.

Figure 8A:
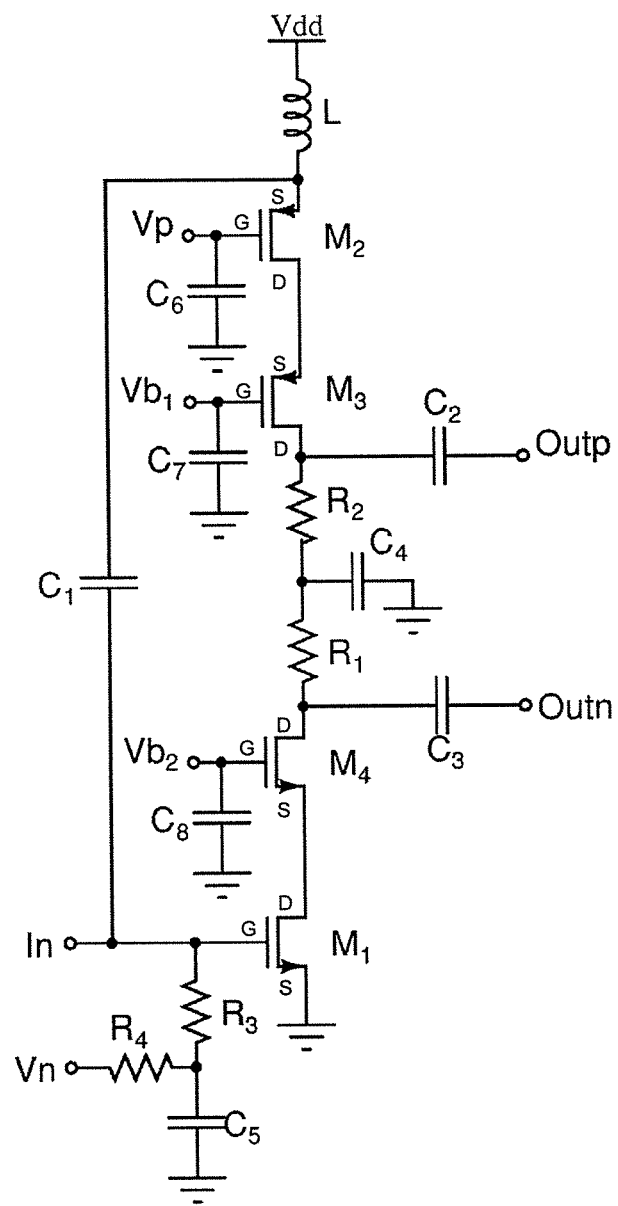
FIG. 8A shows an example of an LNA that includes cascode amplifiers and resistive loads.

FIGS. 8A-8B and FIGS. 9A-9B show some additional examples of LNAs that utilize cascode devices. Each cascode is a two-stage amplifier made up of a transconductance amplifier followed by a current buffer. FIG. 8A includes a first and second cascodes on the DC current path. The first cascode includes transistor M2 in a common-gate configuration, which acts as a transconductance amplifier, as well as transistor M3, which acts as a current buffer. The second cascode includes transistor M1 in a common-source configuration, which acts as a transconductance amplifier, as well as transistor M4, which acts as a current buffer. Compared to a single amplifier stage, these cascodes may have higher input impedance and higher gain. The cascodes improve input-output isolation (or reverse transmission) as there is no direct coupling from the output to input. This mitigates the Miller effect.

Figure 8B:
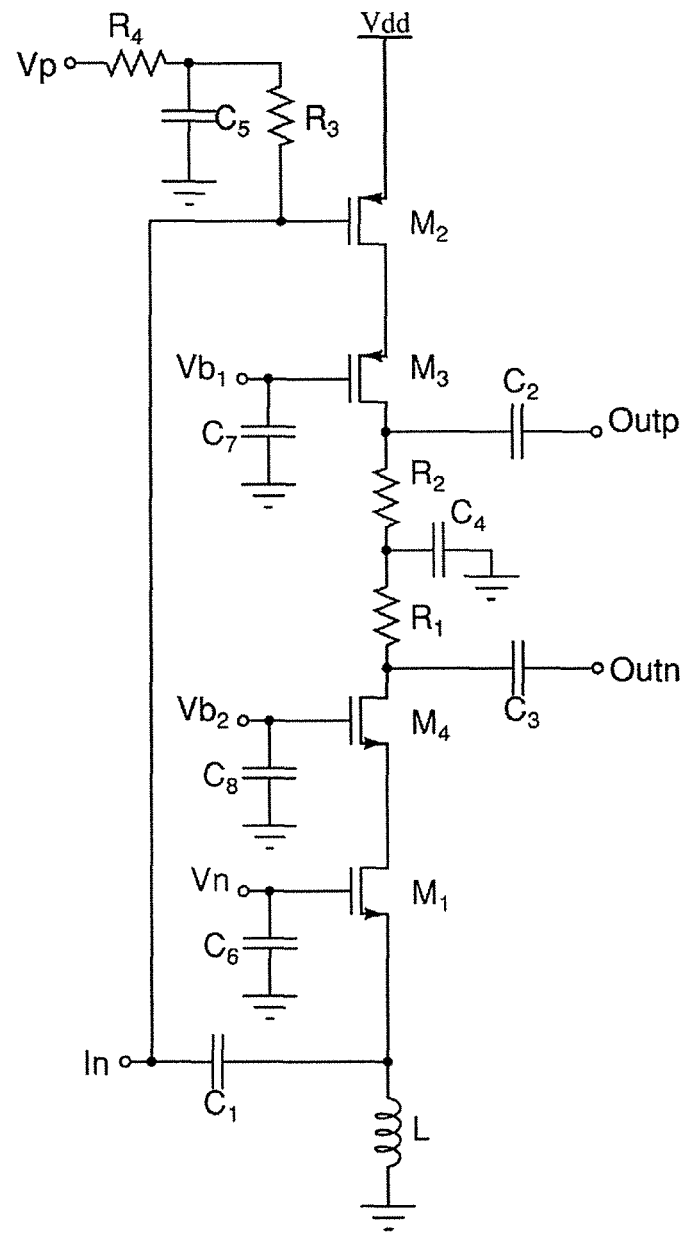
FIG. 8B shows an example of an LNA where the input connections and biasing circuit of FIG. 8A have been rearranged so the common-source NMOS transistor of FIG. 8A is replaced by a common gate NMOS transistor in FIG. 8B and the common gate PMOS transistor of FIG. 8A has been replaced by a common source PMOS transistor in FIG. 8B

FIG. 8B shows an example of an LNA 850 where the input connections and biasing circuit of FIG. 8A have been rearranged so the common-source NMOS transistor (M1) of FIG. 8A is replaced by a common gate NMOS transistor (M1) in FIG. 8B and the common gate PMOS transistor (M2) of FIG. 8A has been replaced by a common source PMOS transistor (M2) in FIG. 8B. Thus, the functionality of the upper and lower portions of the LNA have been swapped.

Figure 9A:
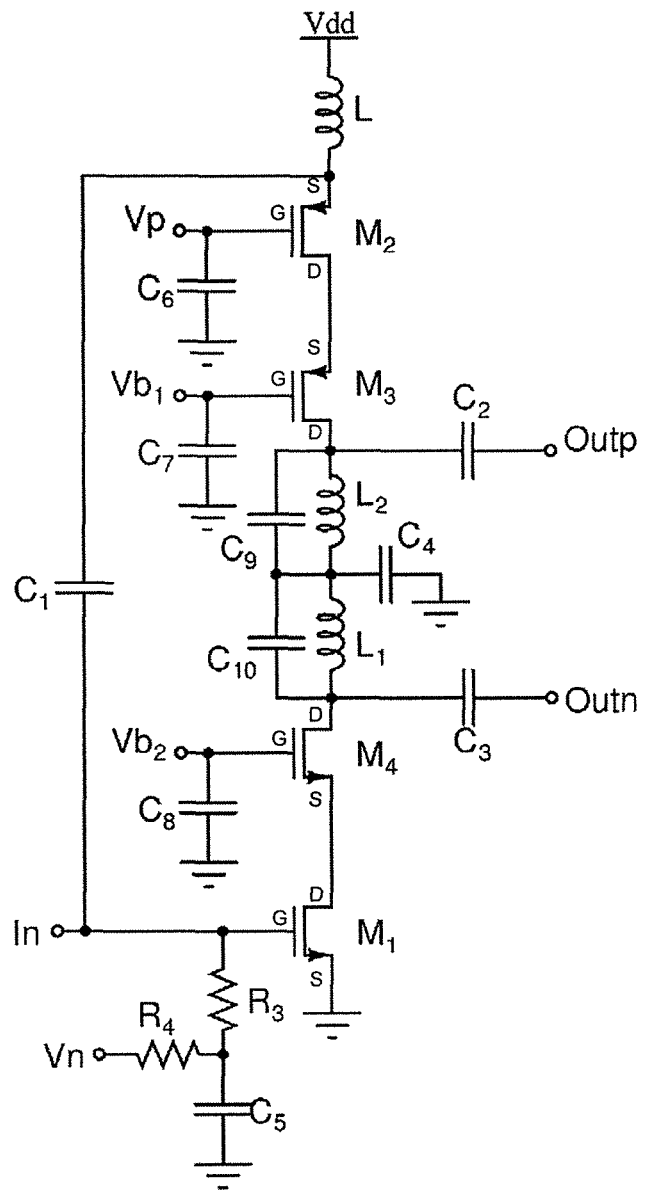
FIG. 9A shows an example of an LNA that includes cascode amplifiers and active loads with on-chip passive inductors.
Figure 9B:
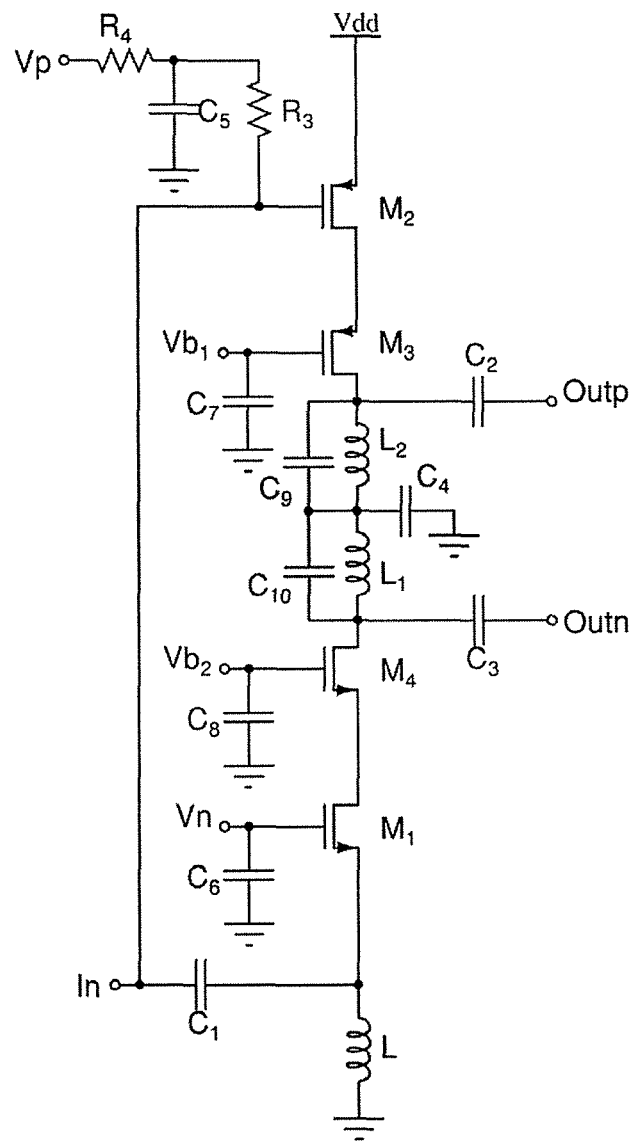
FIG. 9B shows an example of an LNA where the input connections and biasing circuit of FIG. 9A have been rearranged so the common-source NMOS transistor of FIG. 9A is replaced by a common gate NMOS transistor in FIG. 9B and the common gate PMOS transistor of FIG. 9A has been replaced by a common source PMOS transistor in FIG. 9B.

FIG. 9A shows another example of an LNA 900, wherein the passive resistors R1, R2 of FIG. 8A are replaced by LC tank circuits (e.g., L1/C10 and L2/C9, respectively). The passive resistors R1, R2 of FIG. 8A/8B can also be replaced by active resistors. FIG. 9B shows an example of an LNA 950 where the input connections and biasing circuit of FIG. 9A have been rearranged so the common-source NMOS transistor (M1) of FIG. 9A is replaced by a common gate NMOS transistor (M1) in FIG. 9B and the common gate PMOS transistor (M2) of FIG. 9A has been replaced by a common source PMOS transistor (M2) in FIG. 9B. Thus, the functionality of the upper and lower portions of the LNA have been swapped.

Thus, it will be appreciated that some aspects of the present disclosure relate to a low-noise amplifier (LNA) having a balun configuration. The LNA includes a DC current path coupling a first DC supply node to a second DC supply node. First and second output nodes and first and second input nodes are spaced apart along a length of the DC current path. A single-ended radio frequency (RF) input terminal is configured to deliver a single-ended RF signal to the first and second input nodes. A differential RF output terminal is made up of the first and second output nodes. The first and second output nodes are configured to cooperatively establish a differential output signal based on the single-ended RF signal.

Other aspects of the present disclosure relate to a receiver. The receiver includes a radio frequency (RF) antenna port on which an RF signal is received. A surface acoustic wave (SAW) filter filters the RF signal to provide a single-ended RF signal. A low-noise amplifier (LNA), which has a balun configuration, provides a differential amplified signal based on the single-ended RF signal. The LNA includes a DC current path that couples a first DC supply node to a second DC supply node. First and second input nodes and first and second output nodes are spaced apart along a length of the DC current path. A single-ended RF input terminal receives the single-ended RF signal and provides the single-ended RF signal to the first and second input nodes. A differential RF output terminal is made up of the first and second output nodes. The first and second output nodes are configured to cooperatively establish a differential output signal based on the single-ended RF signal Still other aspects relate to a low-noise amplifier (LNA) having a balun configuration. This LNA includes a DC current path coupling a VDD supply node to a VSS supply node. First and second inner nodes and first and second outer nodes are arranged in series along a length of the DC current path. A single-ended radio frequency (RF) input terminal delivers a single-ended RF signal to the first and second outer nodes substantially simultaneously. A differential RF output terminal is made up of the first and second inner nodes. The first and second inner nodes are configured to cooperatively establish a differential output signal based on the single-ended RF signal.

In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the disclosure. Further, although the terms "first", "second" "third" and the like are used in this specification, it will be appreciated that such terms are merely generic identifiers and do not imply any spatial or temporal relationship between the various features. Also, although terms such as "upper", "lower", "above", and "below" are used herein, it is to be appreciated that no absolute reference frame (e.g., the ground beneath one's feet) is implied with respect to these and other similar terms. Rather, any coordinate frame can be selected for such terms. In addition, while a particular aspect may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A low-noise amplifier (LNA) having a balun configuration, comprising:
   a DC current path coupling a first DC supply node to a second DC supply node, wherein first and second output nodes and first and second input nodes are spaced apart along a length of the DC current path;
   a single-ended radio frequency (RF) input terminal configured to deliver a single-ended RF signal to the first and second input nodes;
   a differential RF output terminal made up of the first and second output nodes, wherein the first and second output nodes are configured to cooperatively establish a differential output signal based on the single-ended RF signal; and
   a virtual AC ground point arranged between the first and second output nodes;
   wherein a capacitor couples the virtual AC ground point to the second DC supply node:
   wherein the first DC supply node is a VDD supply node and wherein the second DC supply node is a ground or VSS supply node;
   wherein the first input node corresponds to a source of a common-gate amplifier that is part of a first cascode amplifier on the DC current path, and wherein the second input node corresponds to a gate of a common-source amplifier that is part of a second cascode amplifier on the DC current path.

2. The LNA of claim 1, wherein the DC current path comprises:
   an RF choke arranged between the first input node and the VDD supply node.

3. The LNA of claim 2, wherein the RF choke comprises an inductor.

4. A low-noise amplifier (LNA) having a balun configuration, comprising:
   a DC current path coupling a first DC supply node to a second DC supply node, wherein first and second output nodes and first and second input nodes are spaced apart along a length of the DC current path;
   a single-ended radio frequency (RF) input terminal configured to deliver a single-ended RF signal to the first and second input nodes;
   a differential RF output terminal made up of the first and second output nodes, wherein the first and second output nodes are configured to cooperatively establish a differential output signal based on the single-ended RF signal; and
   a virtual AC ground point arranged between the first and second output nodes;
   wherein a capacitor couples the virtual AC ground point to the second DC supply node;
   wherein the first DC supply node is a VDD supply node and wherein the second DC supply node is a ground or VSS supply node;
   wherein the first input node corresponds to a gate of a common-source amplifier that is part of a first cascode amplifier on the DC current path, and wherein the second input node corresponds to a source of a common-gate amplifier that is part of a second cascode amplifier on the DC current path.

5. The LNA of claim 4, wherein the DC current path comprises:
   an RF choke arranged between the second input node and the VSS supply node.

6. The LNA of claim 5, wherein the RF choke comprises an inductor.

* * * * *